(12) United States Patent
Takahashi

(10) Patent No.: US 9,736,945 B2
(45) Date of Patent: Aug. 15, 2017

(54) PRINTED WIRING BOARD

(71) Applicant: IBIDEN CO., LTD., Ogaki-shi (JP)

(72) Inventor: Nobuya Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 167 days.

(21) Appl. No.: 14/813,218

(22) Filed: Jul. 30, 2015

(65) Prior Publication Data

US 2016/0037629 A1 Feb. 4, 2016

(30) Foreign Application Priority Data

Jul. 30, 2014 (JP) .................. 2014-154857

(51) Int. Cl.
*H05K 1/09* (2006.01)
*H05K 3/18* (2006.01)
(Continued)

(52) U.S. Cl.
CPC .......... *H05K 3/18* (2013.01); *H01L 23/49866* (2013.01); *H01L 23/5386* (2013.01); *H01L 24/17* (2013.01); *H05K 1/09* (2013.01); *H05K 3/16* (2013.01); *H01L 21/4857* (2013.01); *H01L 23/5383* (2013.01); *H01L 23/5384* (2013.01); *H01L 24/13* (2013.01); *H01L 24/16* (2013.01); *H01L 24/32* (2013.01); *H01L 24/73* (2013.01); *H01L 25/0655* (2013.01); *H01L 25/18* (2013.01); *H01L 2224/131* (2013.01); *H01L 2224/16227* (2013.01); *H01L 2224/16238* (2013.01); *H01L 2224/1703* (2013.01); *H01L 2224/32225* (2013.01); *H01L 2224/73204* (2013.01); *H01L 2924/1436* (2013.01); *H01L 2924/15192* (2013.01); *H01L 2924/15311* (2013.01); *H05K 1/111* (2013.01); *H05K 1/141* (2013.01); *H05K 3/4007* (2013.01); *H05K 2201/0391* (2013.01); *H05K 2201/0769* (2013.01); *H05K 2201/094* (2013.01); *H05K 2201/097* (2013.01); *H05K 2201/098* (2013.01); *H05K 2201/09236* (2013.01); *H05K 2201/09736* (2013.01)

(58) Field of Classification Search
CPC .......... H05K 1/09; H05K 1/092; H05K 1/095; H05K 1/097
See application file for complete search history.

(56) References Cited

FOREIGN PATENT DOCUMENTS

JP 10-242639 A 9/1998

*Primary Examiner* — Jeremy C Norris
(74) *Attorney, Agent, or Firm* — Oblon, McClelland, Maier & Neustadt, L.L.P.

(57) ABSTRACT

A printed wiring board includes an insulation layer, conductive pads formed on the insulation layer and positioned to connect an electronic component, and a conductive wiring pattern including first and second conductive patterns and formed on the insulation layer such that the conductive wiring pattern is extending between the conductive pads. The first pattern includes first wiring lines, the second pattern includes second wiring lines, the first and second conductive patterns are formed such that the first wiring lines and the second wiring lines are alternately arrayed on the insulation layer, each of the first wiring lines includes a first metal layer formed on an interface with the insulation layer, each of the second wiring lines includes a second metal layer formed on an interface with the insulation layer, and the first metal layer includes a metal material which is different from a metal material forming the second metal layer.

20 Claims, 14 Drawing Sheets

(51) Int. Cl.
*H05K 3/16* (2006.01)
*H01L 23/498* (2006.01)
H05K 1/11 (2006.01)
H05K 1/14 (2006.01)
H05K 3/40 (2006.01)
H01L 23/00 (2006.01)
H01L 25/065 (2006.01)
H01L 25/18 (2006.01)
H01L 21/48 (2006.01)
H01L 23/538 (2006.01)

PRINTED WIRING BOARD

CROSS-REFERENCE TO RELATED APPLICATIONS

The present application is based upon and claims the benefit of priority to Japanese Patent Application No. 2014-154857, filed Jul. 30, 2014, the entire contents of which are incorporated herein by reference.

BACKGROUND OF THE INVENTION

Field of the Invention

The present invention relates to a printed wiring board having conductive pads and conductive wiring patterns on an insulation layer.

Description of Background Art

A printed wiring board may have multiple conductive pads to mount an electronic component, and a conductive pattern made of wiring lines may be formed on the outermost insulation layer of the printed wiring board (see JP H10-242639A, for example). The entire contents of this publication are incorporated herein by reference.

SUMMARY OF THE INVENTION

According to one aspect of the present invention, a printed wiring board includes an insulation layer including an insulative material, conductive pads formed on the insulation layer such that the conductive pads are positioned to connect an electronic component, and a conductive wiring pattern including a first conductive pattern and a second conductive pattern and formed on the insulation layer such that the conductive wiring pattern is extending between the conductive pads. The first conductive pattern includes first wiring lines, the second conductive pattern includes second wiring lines, the first conductive pattern and the second conductive pattern are formed such that the first wiring lines and the second wiring lines are alternately arrayed on the insulation layer, each of the first wiring lines includes a first metal layer formed on an interface with the insulation layer, each of the second wiring lines includes a second metal layer formed on an interface with the insulation layer, and the first metal layer includes a metal material which is different from a metal material forming the second metal layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
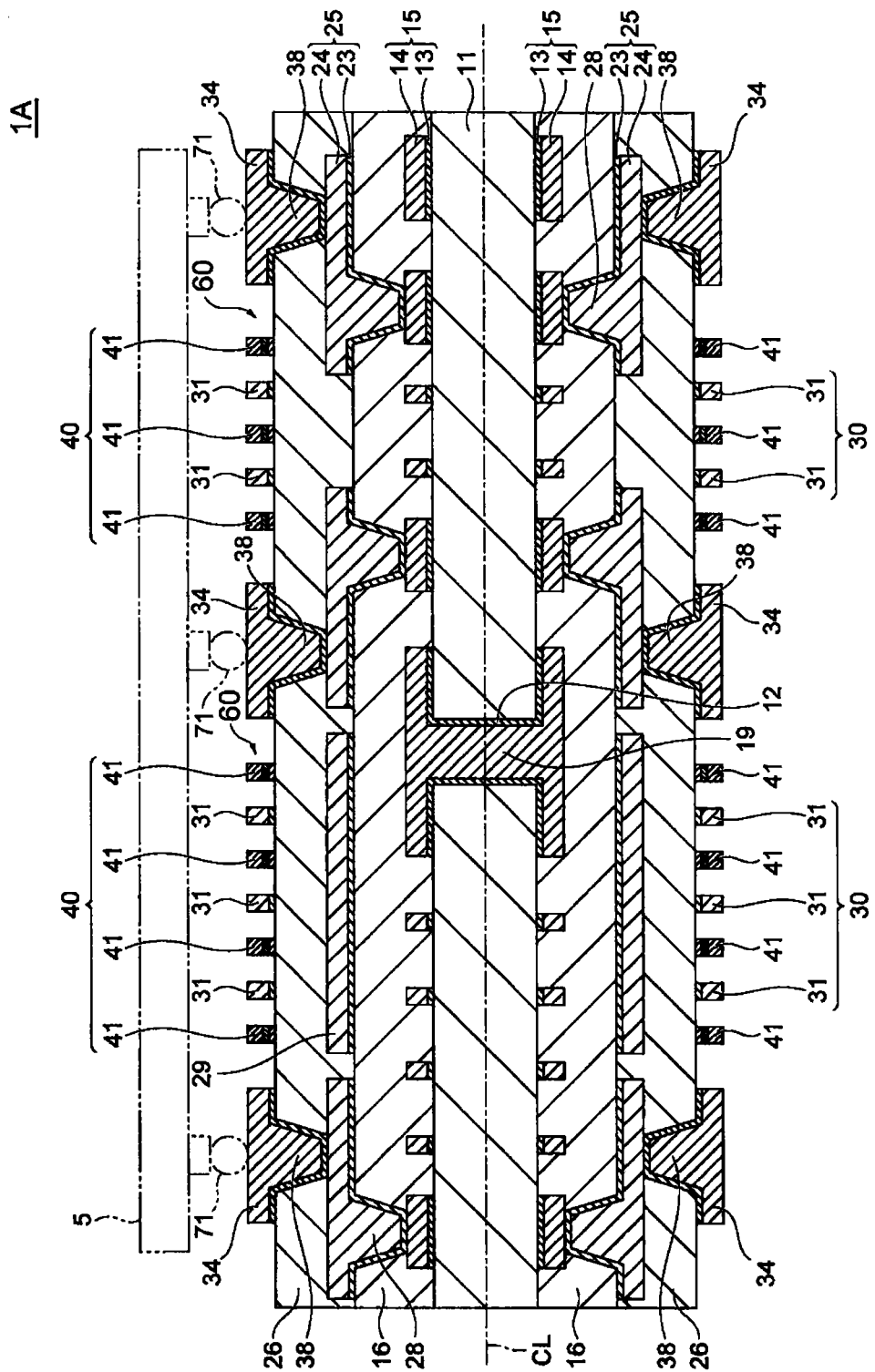
FIG. 1 schematically shows a cross-sectional view of a printed wiring board according to a first embodiment of the present invention.

The embodiments will now be described with reference to the accompanying drawings, wherein like reference numerals designate corresponding or identical elements throughout the various drawings. The following are descriptions of printed wiring boards according to two embodiments and modified examples of the present invention by referring to the accompanying drawings.

First Embodiment

1. Printed Wiring Board

1-1. Inner Conductive Layer and Insulation Layer

As shown in FIG. 1, printed wiring board (1A) according to a first embodiment is a plate or film substrate that forms electronic circuits by fixing an electronic component onto its outermost layer and by making electrical connection with the component. In the present embodiment, printed wiring board (1A) is a multilayer wiring board.

More specifically, printed wiring board (1A) is a buildup multilayer wiring board formed by alternately laminating an insulation layer and a conductive layer on each of both sides of core substrate 11 so as to sandwich core substrate 11. Through-hole conductors 19 are formed to electrically connect both sides of the core substrate. In the present embodiment, printed wiring board (1A) is structured to be vertically symmetrical at center axis (CL) of core substrate 11. Thus, the portion on the upper side (one side) of center axis (CL) is used in the following descriptions. Here, printed wiring board (1A) is set to be vertically symmetrical at center axis (CL); however, that is not the only option. Printed wiring board (1A) may also be asymmetrical depending on an electronic component to be mounted thereon, and its structure may be selected as desired.

One electronic component 5 is mounted in the present embodiment. However, multiple electronic components may be mounted as shown in a second embodiment. Electronic component 5 is a semiconductor element such as an MPU (micro-processing unit) and DRAM (dynamic random access memory).

First conductive layer 15 is formed on a surface of core substrate 11. First conductive layer 15 is formed by laminating electroless plating layer 13 and electroplating layer 14 in that order. Electroless plating layer 13 is a seed layer to perform electrolytic plating (to form electroplating layer 14) on a surface of core substrate 11 made of insulative material. Such a seed layer may also be formed by sputtering. First conductive layer 15 is covered by first insulation layer 16. First insulation layer 16 is made of thermosetting epoxy resin, or photosensitive resin, containing 60~80 mass % of inorganic filler.

First conductive vias 28 are formed in first insulation layer 16 to be connected to first conductive layer 15, and second conductive layer 25 is formed on the surface of first insulation layer 16. The same as first conductive layer 15, second conductive layer 25 is formed by laminating electroless plating layer 23 and electroplating layer 24 in that order. Moreover, second conductive layer 25 is covered by second insulation layer 26. Second insulation layer 26 is made from the same material as that for first insulation layer 16.

By forming second insulation layer 26 as above, first conductive layer 15 and second conductive layer 25 become inner conductive-circuit layers to be positioned opposite later-described conductive wiring pattern 60 with second insulation layer 26 sandwiched in between. In the present embodiment, second conductive layer 25 as an inner conductive-circuit layer further includes later-described planar (thin-film) conductive layer 29 that extends in a direction where portions of conductive pattern 60 are arrayed. Planar conductive layer 29 is electrically connected to a grounding layer that is part of second conductive layer 25 (not shown).

1-2. Conductive Layer Positioned Outermost (Outermost Conductive Layer)

A conductive layer positioned outermost among multiple conductive layers is formed on second insulation layer 26. The conductive layer is formed with multiple conductive pads (34, 34, . . . ) connected to electronic component 5 and conductive wiring pattern 60 formed between conductive pads (34, 34). Each conductive pad 34 is electrically connected to second conductive layer 25 through second conductive via 38 formed in second insulation layer 26. Upper surfaces of multiple conductive pads 34 are made flush with the upper surface of conductive wiring pattern 60.

Figure 2:
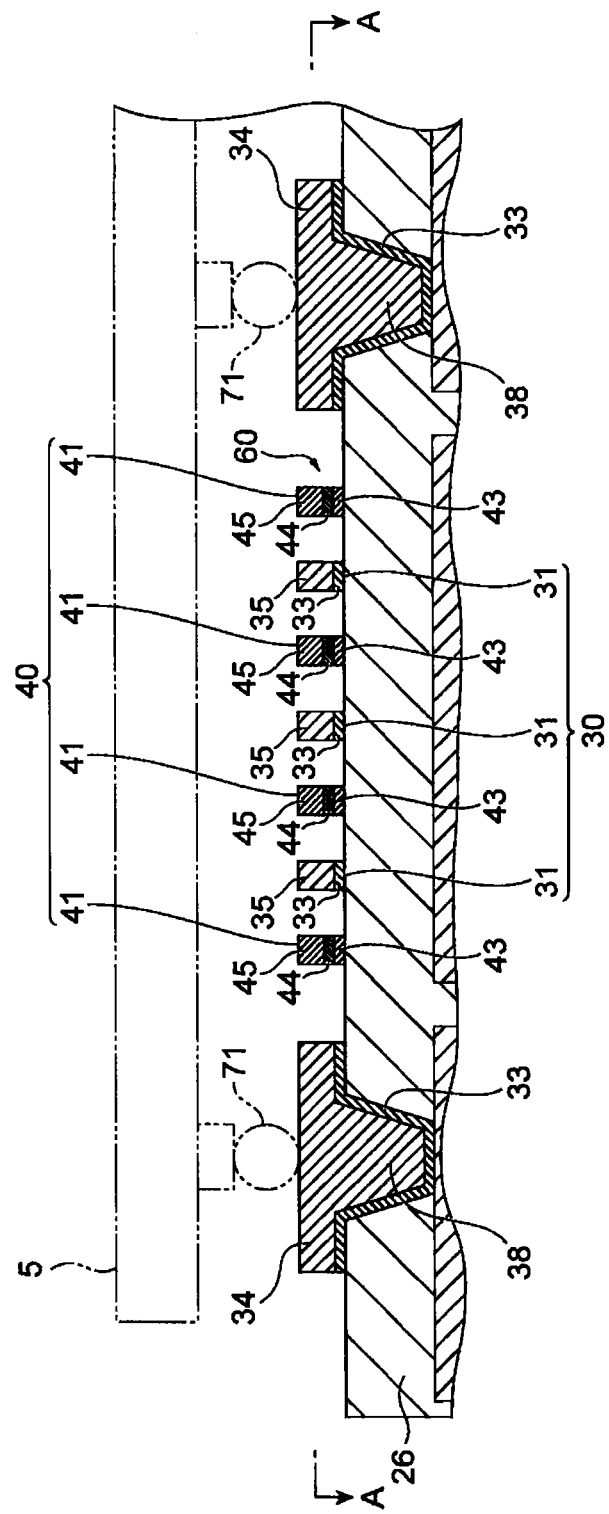
FIG. 2 is an enlarged view showing part of an outermost layer of the printed wiring board shown in FIG. 1.
Figure 3:
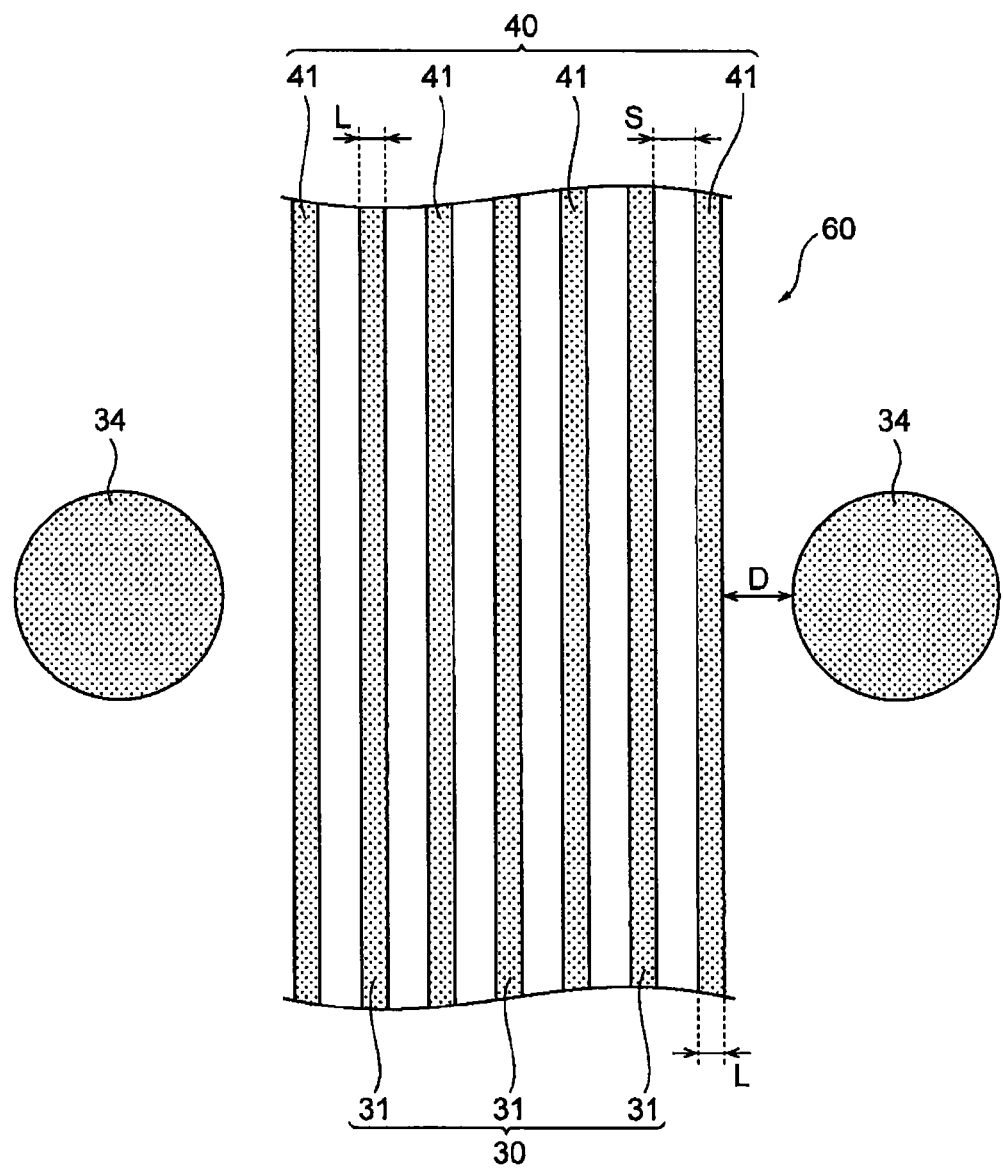
FIG. 3 is a view taken at the A-A arrow line near conductive pads shown in FIG. 2.

As shown in FIG. 1~3, conductive wiring pattern 60 includes first conductive pattern 30 and second conductive pattern 40 formed on second insulation layer 26 to be positioned between conductive pads (34, 34). First conductive pattern 30 has multiple first wiring lines (31, 31, . . . ) and second conductive pattern 40 has multiple second wiring lines (41, 41, . . . ). Multiple first wiring lines (31, 31, . . . ) and second wiring lines (41, 41, . . . ) are alternately positioned on second insulation layer 26.

As shown in FIG. 2, each first wiring line 31 is provided with first metal layer 33 formed on the interface with second insulation layer 26, and each second wiring line 41 is provided with second metal layer 43 on the interface with second insulation layer 26. First metal layer 33 of each first wiring line 31 and second metal layer 43 of each second wiring line 41 are made of metals different from each other.

Since first metal layer 33 and second metal layer 43 are made of different metals in the present embodiment, between two metal layers that are likely to cause ion migration, another metal layer is present, that is less likely to cause ion migration. Accordingly, ion migration is suppressed in either metal layer, thus preventing wiring lines (31, 41) from short circuiting as a result of ion migration.

Especially, among multiple conductive layers, conductive wiring pattern 60 that includes first conductive pattern 30 and second conductive pattern 40 is part of the conductive layer positioned outermost (outermost conductive layer), where ion migration tends to occur. Thus, the above-described setting is effective in conductive wiring pattern 60.

To exhibit the aforementioned effects in the present embodiment, the preferable example is to form first metal layer 33 with copper and second metal layer 43 with titanium. When second metal layer 43 is made of titanium, ion migration is less likely to occur than in first metal layer 33 made of copper. In the present embodiment, first wiring lines 31 and second wiring lines 41 are arrayed alternately. Thus, second metal layer 43 is present between first metal layers (33, 33), where ion migration is more likely to occur than in the metal that forms second metal layer 43. Accordingly, ion migration is suppressed between first metal layers (33, 33), and short circuiting of first wiring lines (31, 31) is thereby suppressed.

In the present embodiment, second metal layer 43 is made of titanium, but second metal layer 43 may also be made of a titanium compound or nickel, for example. The same effects as above are also exhibited when second metal layer 43 is formed with such a metal.

As described in detail later for a manufacturing method, first metal layer 33 is formed by electroless plating, and second metal layer 43 is formed by sputtering. When second metal layer 43 is formed by sputtering, the layer is made denser than first metal layer 33. Accordingly, the metal of second metal layer 43 is suppressed from elution caused by ion migration. Second metal layer 43 works as a barrier layer of metal elution in first metal layer 33.

First wiring line 31 is provided with copper electroplating layer 35 formed on first metal layer 33. Second wiring line 41 is provided with first copper layer 44 formed by sputtering on second metal layer 43 and with second copper layer 45 further formed by electroplating on first copper layer 44.

In second wiring line 41, since first copper layer 44 formed by sputtering is present between second copper layer 45 and second metal layer 43 made of titanium, adhesive intensity is enhanced between second copper layer 45 and second metal layer 43 made of titanium. Moreover, since first copper layer 44 is formed by sputtering, it is made denser than a copper layer formed by electroplating. Accordingly, elution of copper from first copper layer 44 is reduced.

Furthermore, since conductive wiring pattern 60 of the present embodiment is formed by a manufacturing method described in detail later (in particular, the manufacturing method shown in FIG. 9A~9J), it can be made to have a denser wiring structure (fine pattern) than a previous product.

More specifically, wiring line widths (L) of first wiring lines 31 and second wiring lines 41 are 1~5 µm, and wiring line spaces (S) of first wiring lines 31 and second wiring lines 41 are 1~5 µm as shown in FIG. 3. When first wiring lines 31 and second wiring lines 41 are formed at a narrow pitch (namely, conductive wiring pattern 60 is set to have a fine pattern), ion migration tends to occur among wiring lines. However, since first metal layer 33 of first wiring lines 31 and second metal layer 43 of second wiring lines 41 are made of different metals as described above, short circuiting is prevented between first wiring lines 31 and second wiring lines 41 in the present embodiment.

As described above, first wiring line 31 is made of first metal layer 33 and copper electroplating layer 35, and their combined thickness is the thickness of first wiring line 31. Meanwhile, second wiring line 41 is made of second metal layer 43, first copper layer 44 and second copper layer 45, and their combined thickness is the thickness of second wiring line 41. In the present embodiment, the thickness of each first wiring line 31 and the thickness of each second wiring line 41 are preferred to be 70~130% of the thickness of a base wiring line.

Setting the thickness of first wiring line 31 and the thickness of second wiring line 41 as above suppresses variations in electrical characteristics among those wiring lines.

Here, "the thickness of a base wiring line" indicates a wiring thickness set for designing first wiring lines 31 and second wiring lines 41 (target value for manufacturing wiring lines).

In addition, as described above, planar conductive layer 29 is positioned on the insulation layer to be opposite first wiring lines 31 and second wiring lines 41 while being extended in a direction where those wiring lines are densely arrayed. Accordingly, microstrip lines are formed in printed wiring board (1A). Also, heat transmitted from electronic component 5 is radiated through planar conductive layer 29, thus reducing ion migration. Especially, since planar conductive layer 29 is electrically connected to the grounding layer in the present embodiment, effects of microstrip lines are even further exhibited.

As shown in FIG. 3, distance (D) is set to be in a range of 5~15 µm between conductive pad 34 and second wiring line 41 positioned closest of the lines of the conductive wiring pattern. When the distance is set as above for conductive pad 34 and second wiring line 41 positioned closest of the lines of the conductive wiring pattern, and when conductive pad 34 is bonded to electronic component 5 through solder bump 71, short circuiting through solder is prevented in the conductive wiring pattern and conductive pad 34.

2. Modified Example of First Embodiment

In the first embodiment shown in FIG. 1, distance (D) is set to be in a range of 5~15 µm between conductive pad 34 and second wiring line 41 positioned closest of the lines of the conductive wiring pattern, as shown in FIG. 3. However, if solder-resist layer 72 is further formed to cover conductive wiring pattern 60 as in printed wiring board (1B) shown in FIG. 4, it is not necessary to set distance (D) in the above range. In such a structure, solder bumps (71A) are formed in openings in solder-resist layer 72 so that electronic component 5 is mounted on printed wiring board (1B).

In the modified example as well, upper surfaces of multiple conductive pads 34 are made flush with the upper surface of conductive wiring pattern 60 that includes first conductive pattern 30 and second conductive pattern 40, the same as in printed wiring board (1A) shown in FIG. 1. Thus, undulation of solder-resist layer 72 is reduced, and the mounting yield of electronic component 5 is enhanced.

Figure 4:
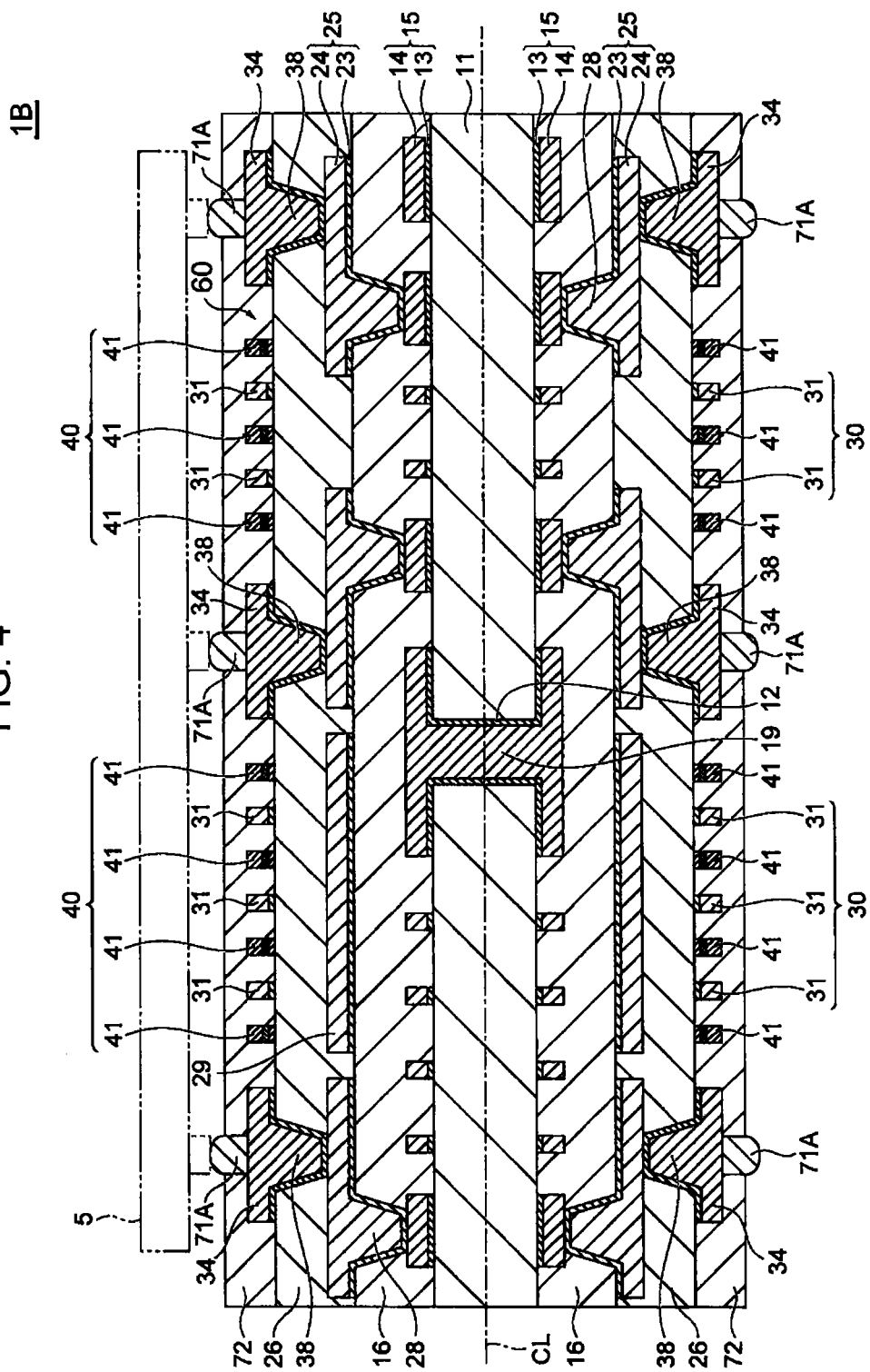
FIG. 4 schematically shows a cross-sectional view of a modified example of the printed wiring board according to the first embodiment shown in FIG. 1.
Figure 5:
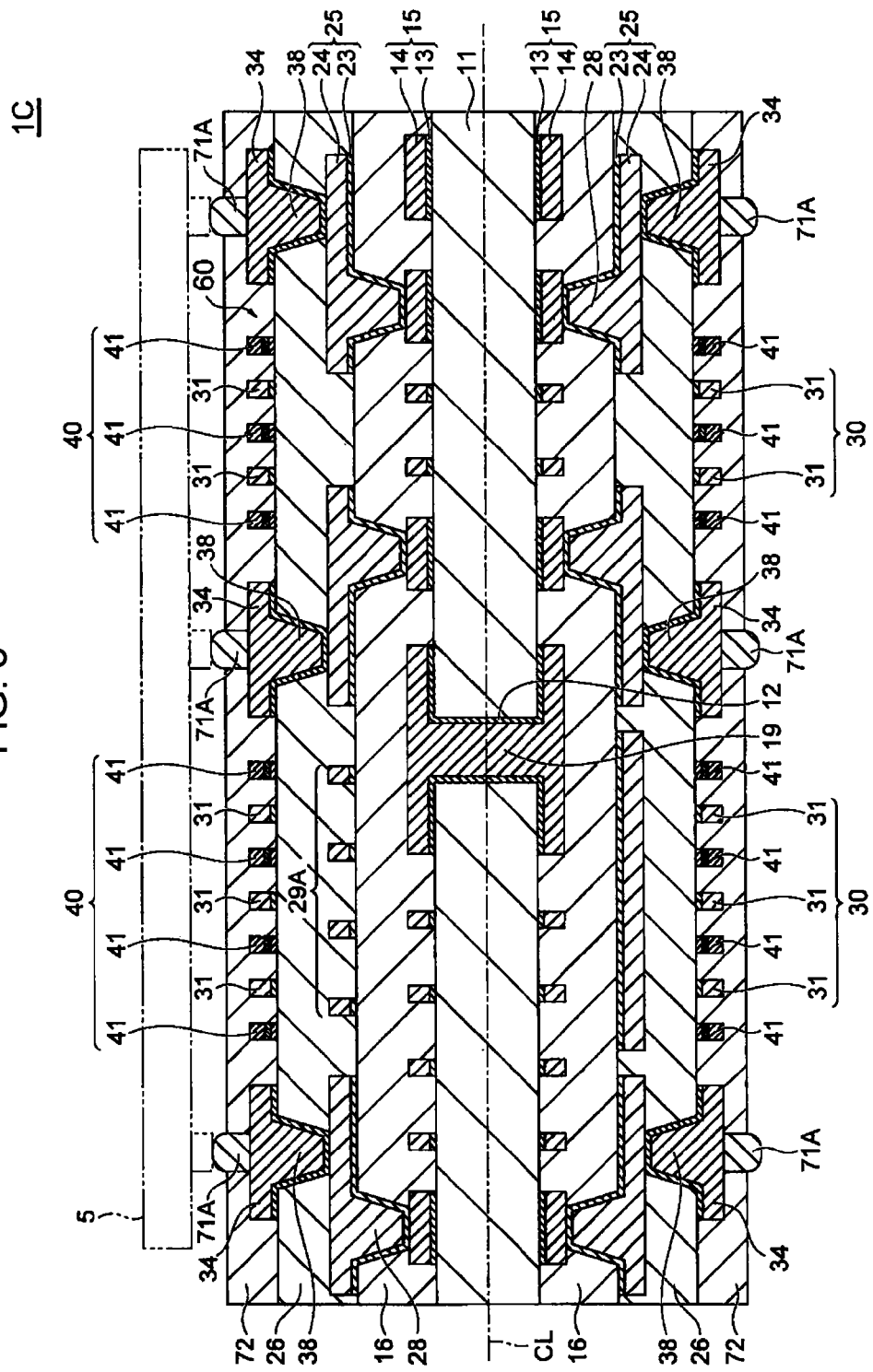
FIG. 5 schematically shows a cross-sectional view of another modified example of the printed wiring board according to the first embodiment shown in FIG. 1.

In printed wiring board (1A) shown in FIG. 1 and printed wiring board (1B) shown in FIG. 4, planar conductive layer 29 is provided in part of second conductive layer 25. However, planar conductive layer 29 is replaced with conductive pattern (29A) in printed wiring board (1C) as shown in FIG. 5. Such a conductive wiring pattern may be formed to have the same structure as the first or second wiring pattern formed on the outermost layer.

3. Method for Manufacturing Printed Wiring Board

Figure 6:
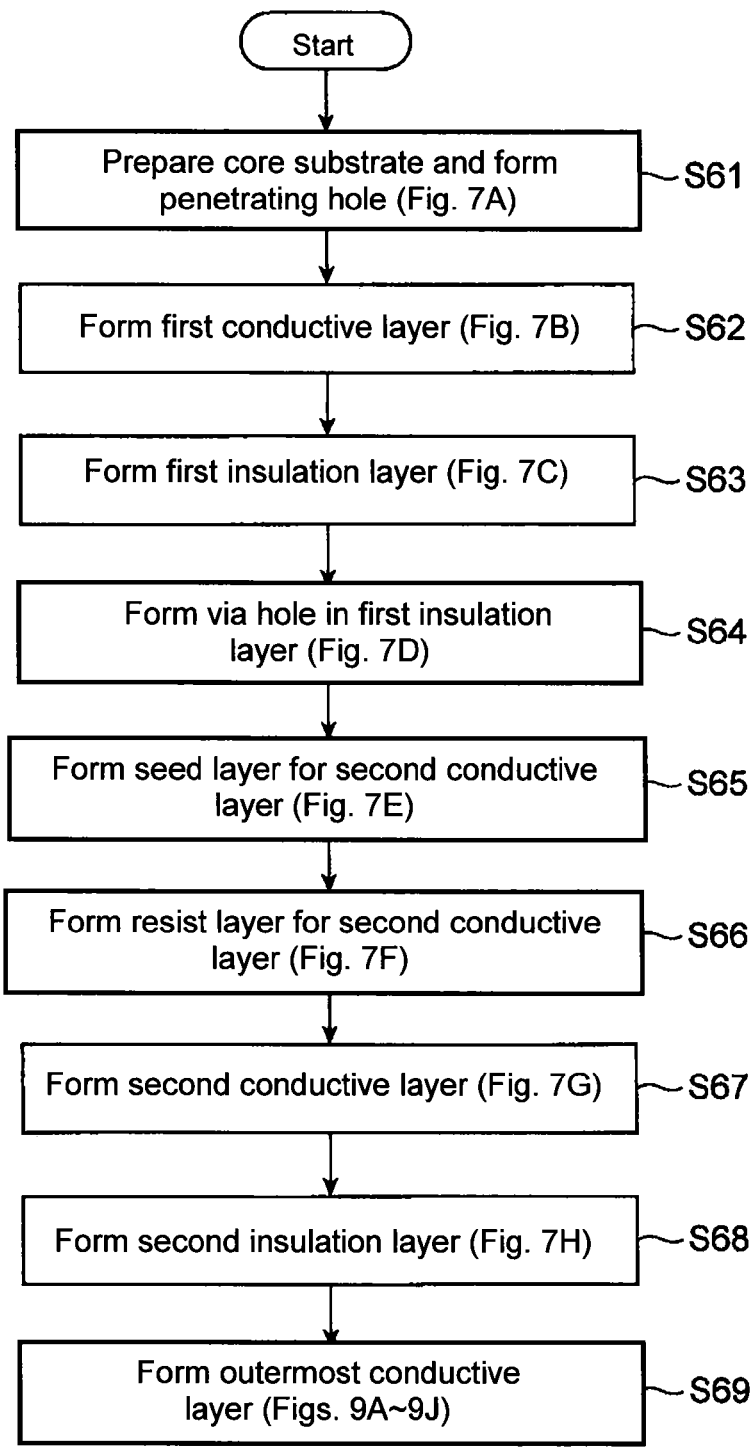
FIG. 6 is a flowchart illustrating a method for manufacturing a printed wiring board shown in FIG. 1.

In the following, a description is provided for a method for manufacturing printed wiring board (1A) shown in FIG. 1. FIG. 6 is a flowchart illustrating a method for manufacturing a printed wiring board shown in FIG. 1. FIG. 7A~7H are schematic views corresponding respectively to the processes shown in FIG. 6.

3-1. Forming Inner Conductive Layer and Insulation Layer

First, in process (S61) of FIG. 6, core substrate 11 is prepared and penetrating holes 12 are formed therein. More specifically, core substrate 11 made of epoxy resin impregnated in a glass-fiber core is prepared. Copper foil (not shown) is formed on main surfaces (11a, 11b) of core substrate 11. Next, penetrating holes 12 are formed in core substrate 11, by irradiating a $CO_2$ laser alternately from the main-surface (11a, 11b) sides of core substrate 11 (see FIG. 7A). After penetrating holes 12 are formed, desmearing is preferred to be conducted on core substrate 11 by immersing the substrate in a solution containing permanganic acid at a predetermined concentration. Desmearing treatment can suppress unwanted conduction (short circuiting).

In process (S62) of FIG. 6, first conductive layer 15 is formed. More specifically, core substrate 11 is immersed in an electroless plating solution to form electroless plating layer 13 on main surfaces (11a, 11b) of core substrate 11 with copper foil formed thereon. Electroless plating layer (13a) is also formed on the inner surfaces of penetrating holes 12. Copper is an example of material for forming electroless plating layer 13. Using electroless plating layer 13 as the seed layer, electroplating layer 14 is formed thereon. Penetrating holes 12 are filled with electroplating material, which subsequently forms through-hole conductors 19.

Next, an etching resist (not shown) with a predetermined pattern is formed on electroplating layer 14. Then, electroless plating layer 13, electroplating layer 14 and copper foil (not shown) are removed from where no etching resist is formed, and then the etching resist is removed. Accordingly, first conductive layer 15 is formed with copper foil, electroless plating layer 13 and electroplating layer 14 that remain on core substrate 11 (see FIG. 7B). First conductive layer 15 on main surface (11a) and first conductive layer 15 on main surface (11b) are electrically connected by through-hole conductors 19.

In process (S63) of FIG. 6, first insulation layer 16 is formed. More specifically, the first insulation layer is formed by covering main surfaces (11a, 11b) of core substrate 11 with insulative material (see FIG. 7C). Examples of insulative material are thermosetting epoxy resin or photosensitive resin containing 30~80 mass % of inorganic filler.

Here, when first insulation layer 16 is formed using thermosetting epoxy resin containing 30~80 mass % of inorganic filler such as SiO, thermal expansion is reduced in first insulation layer 16. If the content of the inorganic filler is less than 30 mass %, thermal expansion of first insulation layer 16 may not be sufficiently reduced. On the other hand, if the content of the inorganic filler exceeds 80 mass %, the amount of thermosetting epoxy resin is too low to obtain desired strength. When photosensitive resin is used, fine-diameter via holes are formed through exposure/development treatments.

Figure 7A:
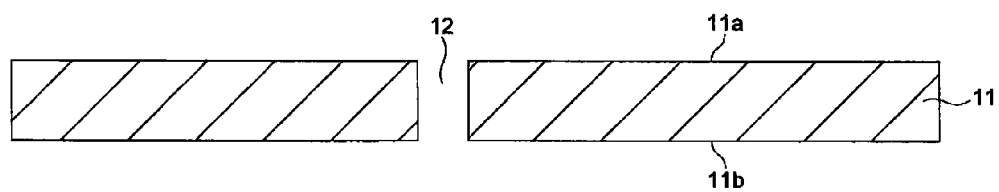
FIG. 7A schematically shows process (S61) of FIG. 6 for preparing a core substrate and forming penetrating holes.
Figure 7B:
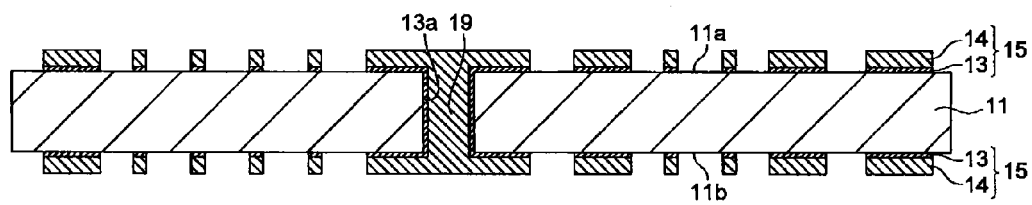
FIG. 7B schematically shows step (S62) of FIG. 6 for forming a first conductive layer.
Figure 7C:
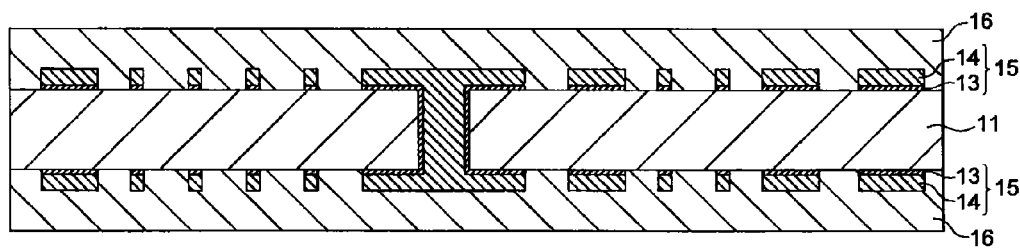
FIG. 7C schematically shows process (S63) of FIG. 6 for forming a first insulation layer.
Figure 7D:
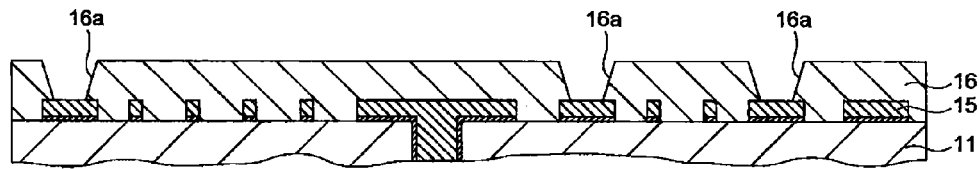
FIG. 7D schematically shows process (S64) of FIG. 6 for forming via holes in the first insulation layer.
Figure 7E:
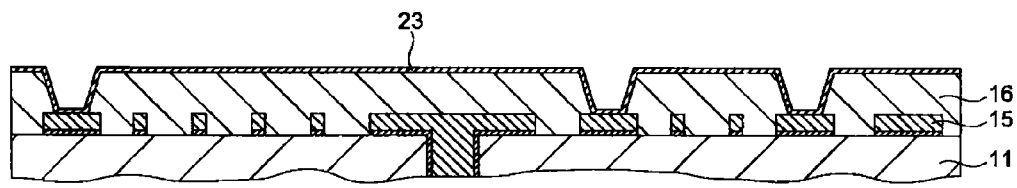
FIG. 7E schematically shows process (S65) of FIG. 6 for forming a seed layer for a second conductive layer.
Figure 7F:
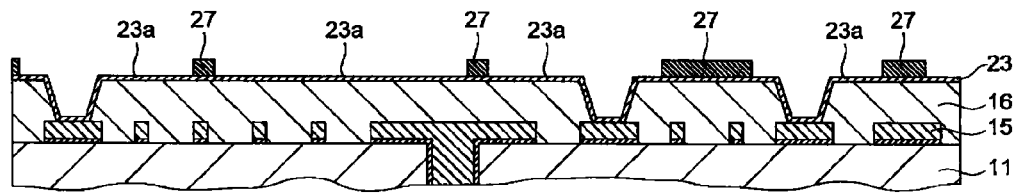
FIG. 7F schematically shows process (S66) of FIG. 6 for forming a resist layer for a second conductive layer.
Figure 7G:
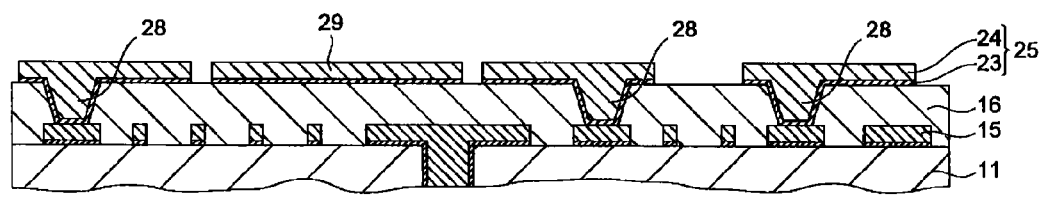
FIG. 7G schematically shows process (S67) of FIG. 6 for forming a second conductive layer.
Figure 7H:
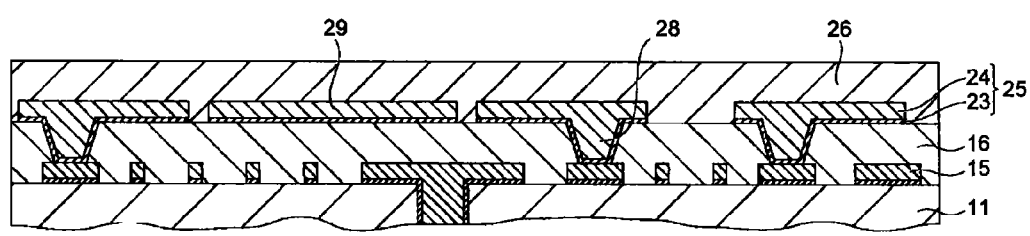
FIG. 7H schematically shows process (S68) of FIG. 6 for forming a second insulation layer.

In process (S64) of FIG. 6, via holes are formed in first insulation layer 16 (see FIG. 7D). Here, if thermosetting epoxy resin is used as the resin material for first insulation layer 16, a $CO_2$ laser is irradiated to form via holes (16a) at predetermined positions of first insulation layer 16. On the other hand, if photosensitive resin is used as the material for forming first insulation layer 16, via holes (16a) are formed through exposure/development treatments.

In process (S65) of FIG. 6, electroless plating layer 23 is formed as the seed layer for forming second conductive layer 25. More specifically, the same as in process (S62), the substrate is immersed in an electroless copper plating solution so that electroless plating layer 23 made of copper is formed on the surface of first insulation layer 16 and on the surface of first conductive layer 15 exposed in via holes (16a) (see FIG. 7E).

In process (S66) of FIG. 6, resist layer 27 for a second conductive layer is formed. Resist layer 27 is obtained by coating a resist liquid on the surface of electroless plating layer 23 and by performing exposure/development treatments using a light-exposure device so as to form a predetermined pattern (see FIG. 7F).

In process (S67) of FIG. 6, second conductive layer 25 is formed. More specifically, on portions not covered by resist layer 27, namely, portions where the electroless plating layer is exposed, electroplating is performed to form electroplating layer 24 and to fill via holes with electroplating material so that first conductive vias 28 are formed. Then, resist layer 27 is removed, and portions of electroless plating layer 23 are etched from where no electroplating layer 24 is laminated. Accordingly, second conductive layer 25 is formed on the surface of first insulation layer 16 (see FIG. 7G). In the present embodiment, planar conductive layer 29 is formed between first conductive vias (28, 28).

Figure 8:
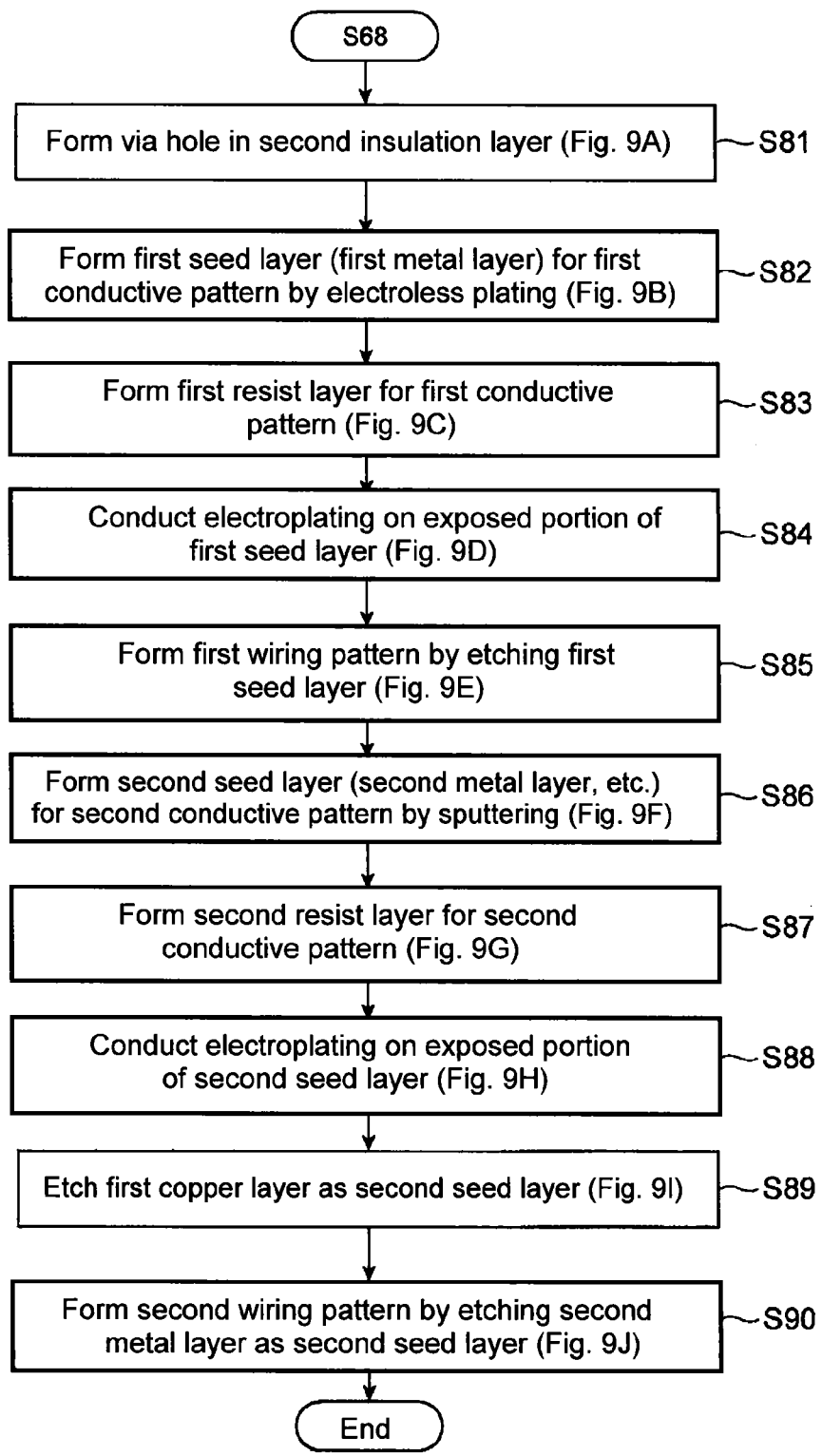
FIG. 8 is a flowchart illustrating in detail process (S69) of FIG. 6 for forming an outermost conductive layer.

In process (S68) of FIG. 6, second insulation layer 26 is formed. More specifically, second insulation layer 26 is formed the same as first insulation layer 16 described in process (S63) of FIG. 6 (see FIG. 7A). Then, an outermost conductive layer is formed on second insulation layer 26 in process (S69) of FIG. 6. FIG. 8 is a flowchart, describing in detail a method for forming an outermost layer in process (S69) of FIG. 6. FIG. 9A~9J are schematic views respectively corresponding to the processes shown in FIG. 8.

3-2. Forming Outermost Conductive Layer

Figure 9A:
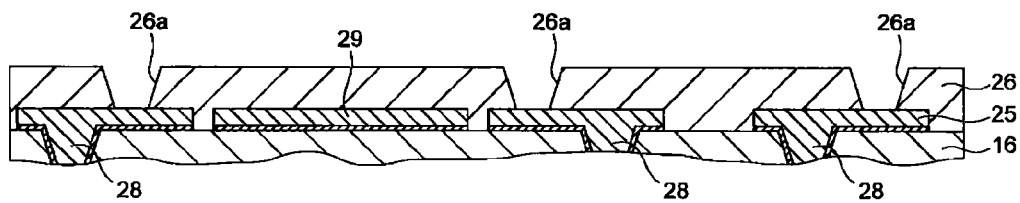
FIG. 9A schematically shows process (S81) of FIG. 8 for forming via holes in the second insulation layer.
Figure 9B:
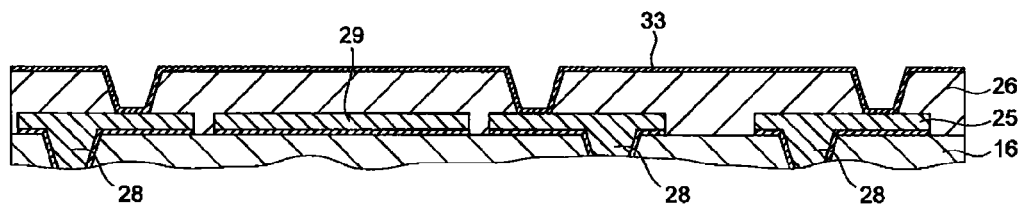
FIG. 9B schematically shows process (S82) of FIG. 8 for forming a first seed layer (first metal layer) for a first conductive pattern by performing electroless plating.
Figure 9C:
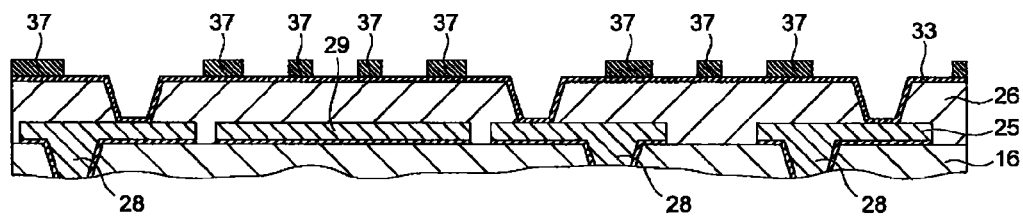
FIG. 9C schematically shows process (S83) of FIG. 8 for forming a first resist layer for a first conductive pattern.
Figure 9D:
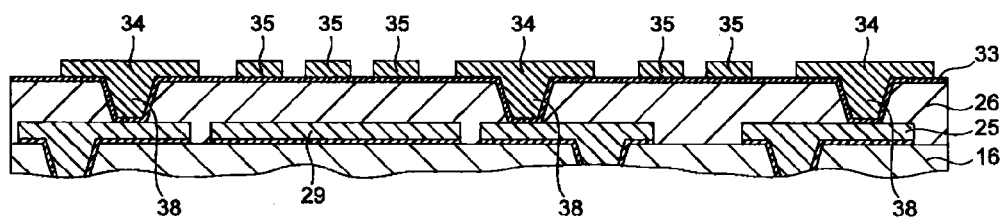
FIG. 9D schematically shows process (S84) of FIG. 8 for performing electroplating on exposed portions of the first seed layer.
Figure 9E:
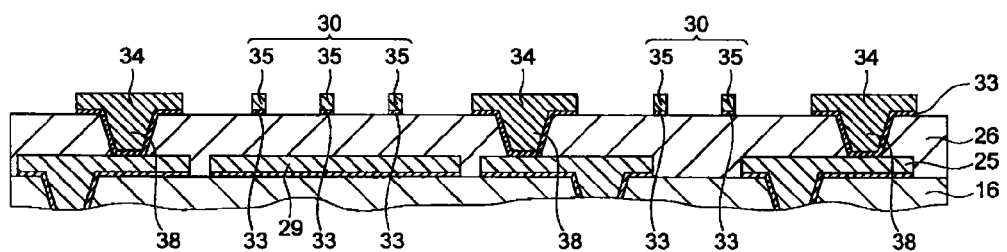
FIG. 9E schematically shows process (S85) of FIG. 8 for forming a first wiring pattern by etching the first seed layer.
Figure 9F:
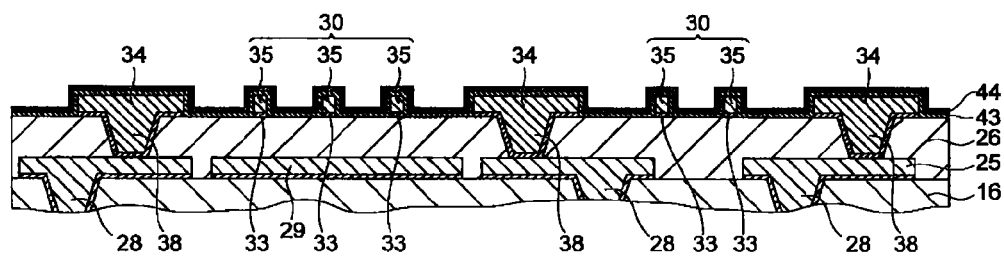
FIG. 9F schematically shows process (S86) of FIG. 8 for forming a second seed layer (second metal layer or the like) for a second conductive pattern by sputtering.
Figure 9G:
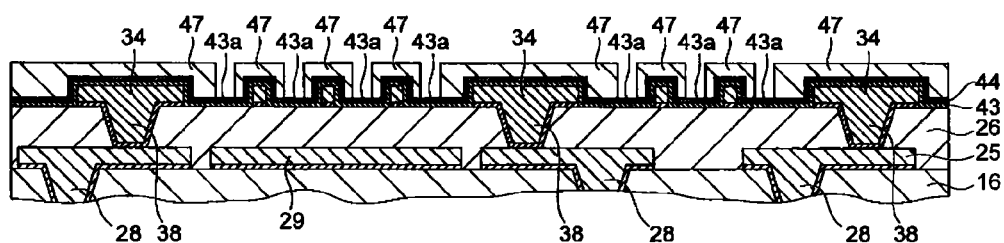
FIG. 9G schematically shows process (S87) of FIG. 8 for forming a second resist layer for a second conductive pattern.
Figure 9H:
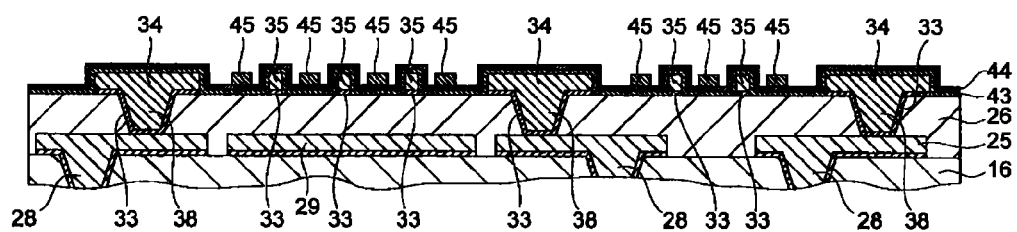
FIG. 9H schematically shows process (S88) of FIG. 8 for performing electroplating on exposed portions of a second seed layer.
Figure 9I:
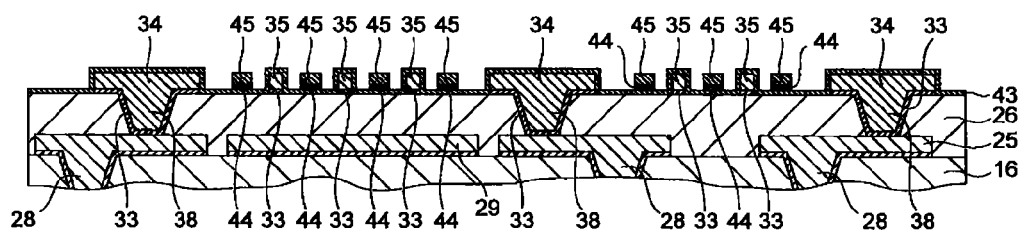
FIG. 9I schematically shows process (S89) of FIG. 8 for etching a first copper layer as a second seed layer.
Figure 9J:
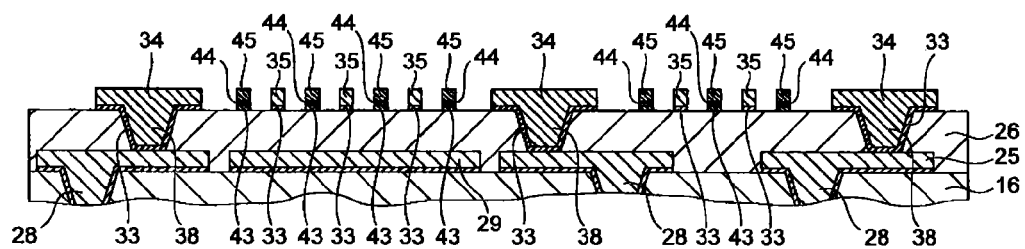
FIG. 9J schematically shows process (S90) of FIG. 8 for forming a second wiring pattern by etching a titanium layer as a second seed layer.

First, in process (S81) of FIG. 8, via holes (26a) are formed in second insulation layer 26 (see FIG. 9A). Here, if thermosetting epoxy resin containing inorganic filler is used as the material for second insulation layer 26, a $CO_2$ laser is irradiated to form via holes (26a) at predetermined positions of second insulation layer 26 the same as above. Using thermosetting epoxy resin containing inorganic filler, second insulation layer 26 is suppressed from thermal expansion when heat is transmitted through conductive pads 34 from electronic component 5. On the other hand, since fine-diameter via holes (26a) are formed through exposure/development treatments, photosensitive resin is preferred for forming second insulation layer 26 to obtain a fine-pattern conductive layer.

In process (S82) of FIG. 8, first metal layer 33 is formed as a first seed layer for forming first conductive pattern 30 by immersing the substrate in an electroless copper plating solution. More specifically, the same as in process (S62) above, the substrate is immersed in an electroless copper plating solution so that first metal layer 33 is formed as an electroless plating layer on the surface of second insulation layer 26 and on the surface of second conductive layer 25 exposed in via holes (26a) (see FIG. 9B).

In process (S83) of FIG. 8, first resist layer 37 is formed for forming first conductive pattern 30. First resist layer 37 is obtained by coating a liquid-type resist on the entire surface of first metal layer 33, and by performing exposure/development treatments using a light-exposure device so that a predetermined pattern is formed (see FIG. 9C). For example, a liquid-type resist is coated on the entire surface of first metal layer 33, which is an electroless plating layer, and heat is applied thereon. Then, at a predetermined level of exposure using a light-exposure device, portions excluding the region corresponding to first conductive pattern 30 are exposed and then developed by a developing solution.

In process (S84) of FIG. 8, electroplating is performed on the exposed portions of first metal layer 33 as a first seed layer. More specifically, copper electroplating is performed on portions not covered by first resist layer 37, namely, portions where the electroless plating layer as first metal layer 33 are exposed, and then first resist layer 37 is removed. Accordingly, second conductive vias 38 are formed while a copper electroplating layer is formed to be part of conductive pads 34 and first conductive pattern 30 (see FIG. 9D).

In process (S85) of FIG. 8, first metal layer 33 as the first seed layer is etched to form first conductive pattern 30. More specifically, first metal layer 33 as the electroless plating layer is etched isotropically from portions where no electroplating layer 24 is laminated by using a sulfuric acid/hydrogen peroxide-based or phosphoric acid/hydrogen peroxide-based solution for etching copper. Since isotropic etching is performed here, the width of the copper electroplating layer is reduced to obtain multiple narrow-pitch wiring lines (31, 31, . . . ) for first conductive pattern 30 (see FIG. 9E, FIG. 2 and the like).

In process (S86) of FIG. 8, second metal layer 43 is formed by sputtering as a second seed layer for forming second conductive pattern 40. More specifically, second metal layer 43 is formed by sputtering using a titanium target to entirely cover conductive pads 34, first conductive pattern 30 and the surface of second insulation layer 26 (see FIG. 9F). Furthermore, to cover second metal layer 43 made of titanium, first copper layer 44 is formed by sputtering using a copper target.

In process (S87) of FIG. 8, second resist layer 47 for second conductive pattern 40 is formed. Here, second resist layer 47 is formed corresponding to the pattern of second conductive pattern 40 while covering conductive pads 34 and first wiring lines 31 of first conductive pattern 30 (see FIG. 9G). Second resist layer 47 is formed the same as first resist layer 37 described in process (S83) above.

In process (S88) of FIG. 8, electroplating is performed on portions where first copper layer 44 as a second seed layer is exposed. More specifically, the same as in process (S84), on portions not covered by second resist layer 47, namely, on portions where first copper layer 44 made by sputtering is exposed, second copper layer 45 is formed by copper electroplating, and then second resist layer 47 is removed (see FIG. 9H).

In process (S89) of FIG. 8, first copper layer 44 as a second seed layer is etched. More specifically, the same as in process (S85), portions of first copper layer 44 are etched from where no second copper layer 45 made of electroplating is laminated (see FIG. 9I).

Finally, in process (S90) of FIG. 8, portions of second metal layer 43 as a second seed layer made of titanium are etched to form second conductive pattern 40. More specifically, of second metal layer 43, which is a second seed layer made of titanium, portions where first copper layer 44 and second copper layer 45 are not laminated are removed isotropically by using a hydrogen peroxide-based or fluoric acid-based solution for etching titanium (see FIG. 9J). Accordingly, fine-pattern printed wiring board (1A) is obtained having first wiring lines 31 and second wiring lines 41 alternately positioned between conductive pads (34, 34) as shown in FIG. 2.

Second Embodiment

Figure 10A:
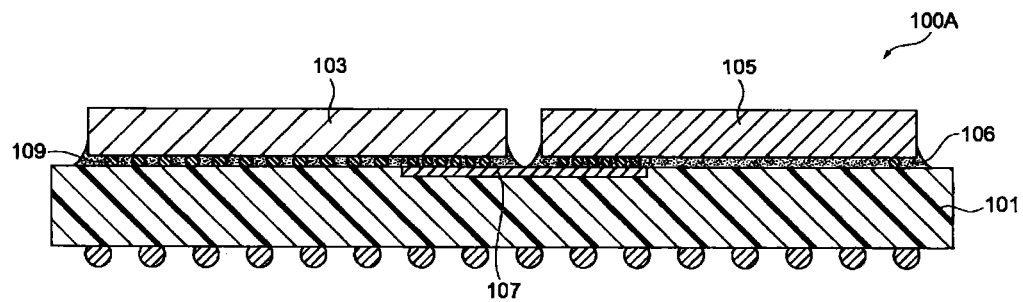
FIG. 10A schematically shows a cross-sectional view of a printed wiring board according to a second embodiment of the present invention.
Figure 10B:
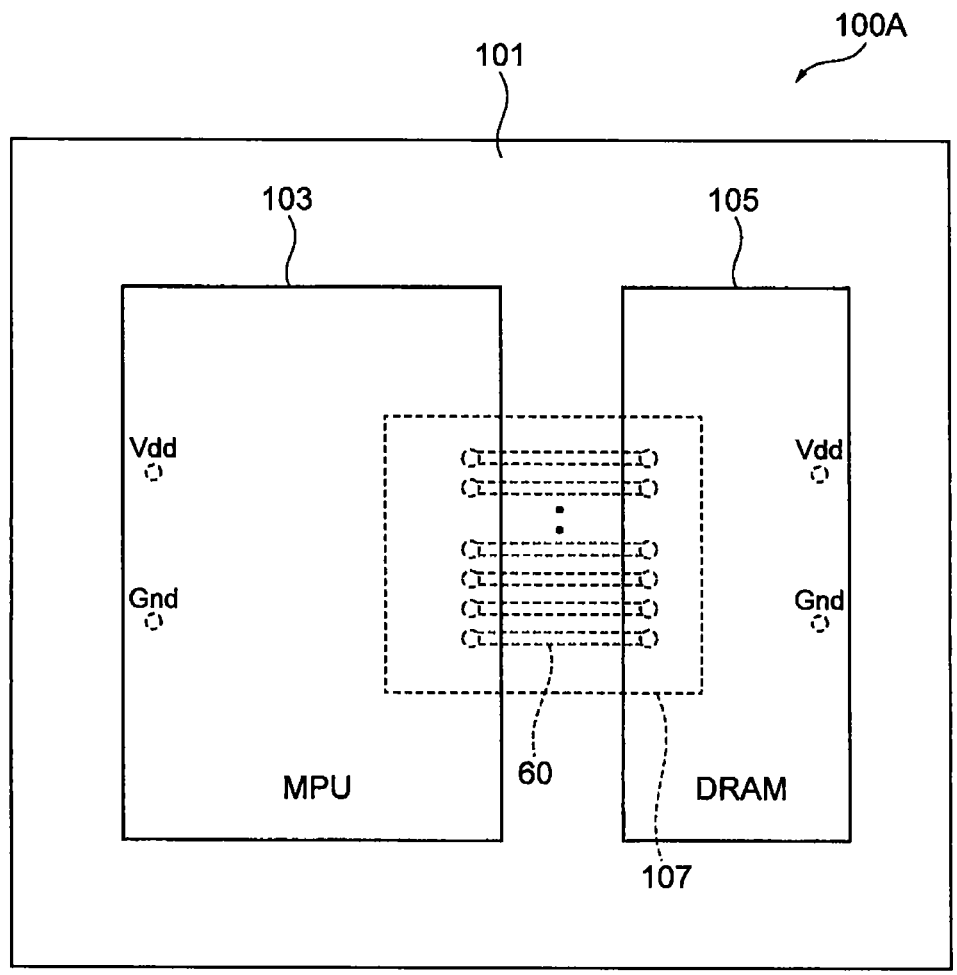
FIG. 10B is a schematic plan view of the printed wiring board shown in FIG. 10A.
Figure 10C:
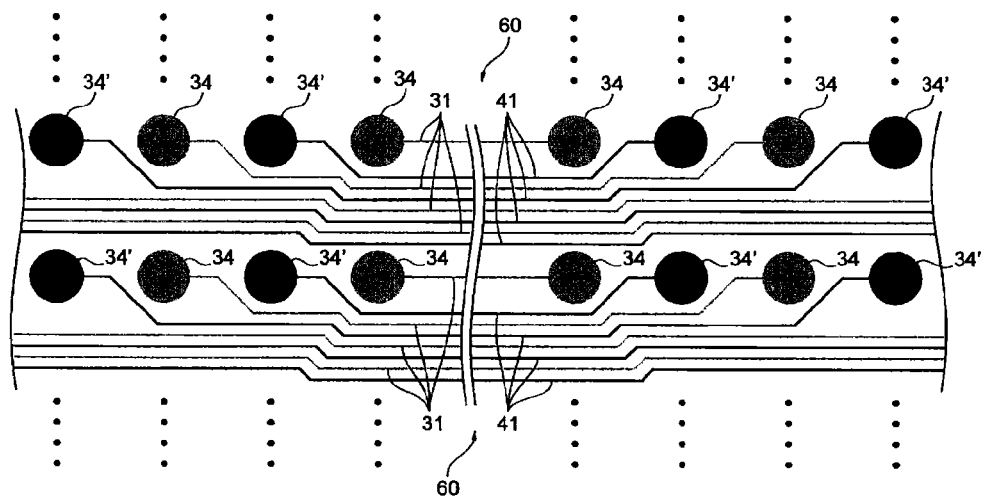
FIG. 10C schematically shows wiring connections of two electronic components in FIG. 10B.

FIG. 10A is a cross-sectional view schematically showing printed wiring board (100A) according to a second embodiment of the present invention, FIG. 10B is a schematic plan view of the printed wiring board shown in FIG. 10A, and FIG. 10C is a schematic view of wiring connections between two electronic components shown in FIG. 10B.

As shown in FIG. 10A and 10B, printed wiring board (100A) according to the second embodiment is structured to have main wiring board 101 and sub wiring board 107.

Main wiring board 101 is a multilayer wiring board formed by alternately laminating insulation layers and conductive layers by using a generally employed method as shown in FIG. 7A~7J above. In main wiring board 101, sub wiring board 107 is positioned and provides finer conductive patterns than main wiring board 101.

On the outermost conductive layer of sub wiring board 107 of the second embodiment, conductive pads (34, 34') and conductive wiring pattern 60 are provided as shown in FIG. 10C. First wiring lines 31 and second wiring lines 41 are alternately arrayed between conductive pads (34, 34) (or conductive pads (34', 34')) positioned vertically in FIG. 10C. The layers of multiple first and second wiring lines (31, 41) are structured the same as those in the first embodiment. Conductive pads (34', 34') shown in FIG. 10C are formed simultaneously when second wiring lines 41 are formed. In addition, sub wiring board 107 is mounted in a recessed portion of main wiring board 101 so that conductive pads of main wiring board 101 are set to be made flush with those of sub wiring board 107. Electronic components (103, 105) are connected to the conductive pads of sub wiring board 107 through solder bumps 109.

By structuring as above, two electronic components (103, 105) such as an MPU and a DRAM arrayed adjacent to each other are connected by narrow-pitch first wiring lines 31 and second wiring lines 41 formed in sub wiring board 107. Because of two electronic components (103, 105), the temperature on the surface of sub wiring board 107 tends to be higher than that of other portions. However, since alternately positioned first wiring lines 31 and second wiring lines 41 are respectively provided with a first metal layer and a second metal layer at the interface with the insulation layer as described above, ion migration from those metal layers is prevented. In addition, since conductive pads of main wiring board 101 and sub wiring board 107 are made flush with each other, undulation of solder-resist layer 106 is reduced, and mounting yield of electronic components (103, 105) is thereby enhanced.

Figure 11:
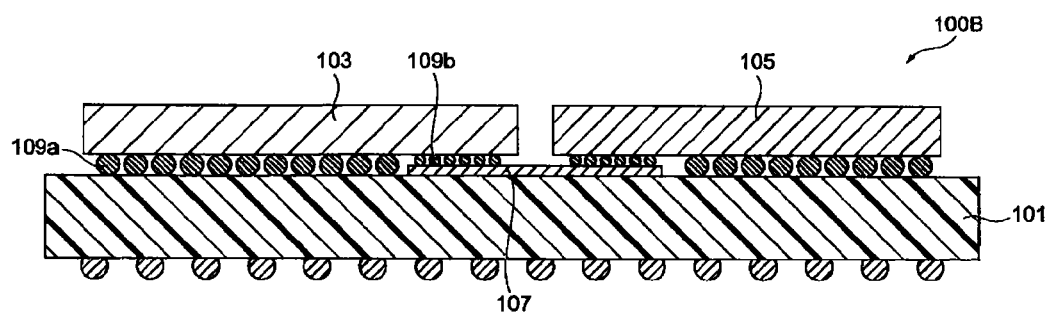
FIG. 11 schematically shows a cross-sectional view of a modified example of a printed wiring board according to the second embodiment shown in FIG. 10.

FIG. 11 is a schematic cross-sectional view showing a modified example of the printed wiring board according to the second embodiment shown in FIG. 10. A plan view of the modified example is substantially the same as that in FIG. 10B, and its detailed description is omitted. As shown in FIG. 11, sub wiring board 107 may be laminated on main wiring board 101 of printed wiring board (100B), which is a modified example of printed wiring board (100A) of the second embodiment. In such a structure, solder bumps (109a) on main wiring board 101 and solder bumps (109b) on sub wiring board 107 are adjusted to have such heights that upper surfaces of those solder bumps are made flush when electronic components (103, 105) are mounted thereon.

A conductive wiring pattern of a printed wiring board may be formed between conductive pads connected to an electronic component, and heat generated in the electronic component tends to be transmitted to the conductive wiring pattern, causing ion migration between the metal layers of adjacent wiring lines. Accordingly, short circuiting may occur between adjacent wiring lines. Especially, such a problem has been more likely to occur in recent years since wiring lines are formed at a narrower pitch as IC chips are becoming finer and more highly integrated.

A printed wiring board according to an embodiment of the present invention is capable of suppressing ion migration in adjacent wiring lines of a conductive wiring pattern formed between conductive pads.

A printed wiring board according to one aspect of the present invention has an insulation layer made of an insulative material, multiple conductive pads formed on the insulation layer to be connected to an electronic component, and a conductive wiring pattern including a first conductive pattern and a second conductive pattern and formed on the insulation layer such that the conductive wiring pattern is positioned between conductive pads. In such a printed wiring board, the first conductive pattern includes multiple first wiring lines, the second conductive pattern includes multiple second wiring lines, the first wiring lines and the second wiring lines are alternately arrayed on the insulation layer, a first metal layer is provided for each of the first wiring lines on the interface with the insulation layer, a second metal layer is provided for each of the second wiring lines on the interface with the insulation layer, and the first metal layer and the second metal layer are made of different metals from each other.

The first and second metal layers are made of different metals from each other according to one aspect of the present invention. Thus, regarding the first and second metal layers, a wiring line made of either metal that is less likely to cause ion migration is present between two wiring lines made of the other metal that is more likely to cause ion migration. Accordingly, ion migration is suppressed from occurring in a metal layer that is likely to cause ion migration. As a result, wiring lines are prevented from short circuiting caused by ion migration.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   an insulation layer comprising an insulative material;
   a plurality of conductive pads formed on the insulation layer such that the plurality of conductive pads is positioned to connect an electronic component; and
   a conductive wiring pattern comprising a first conductive pattern and a second conductive pattern and formed on the insulation layer such that the conductive wiring pattern is extending between the conductive pads, the first conductive pattern comprising a plurality of first wiring lines, the second conductive pattern comprising a plurality of second wiring lines,
   wherein the first conductive pattern and the second conductive pattern are formed such that the first wiring lines and the second wiring lines are alternately arrayed on the insulation layer, each of the first wiring lines comprises a first metal layer formed on an interface with the insulation layer, each of the second wiring lines comprises a second metal layer formed on an interface with the insulation layer, and the first metal layer comprises a metal material which is different from a metal material forming the second metal layer.

2. The printed wiring board according to claim 1, wherein the first metal layer is a layer comprising copper, and the second metal layer is a layer comprising at least one of titanium, a titanium compound and nickel.

3. The printed wiring board according to claim 2, wherein the first metal layer is an electroless plating metal layer, and the second metal layer is a sputtered metal layer.

4. The printed wiring board according to claim 3, wherein each of the second wiring lines comprises a first copper layer sputtered on the second metal layer, and a second copper layer electrolytically plated on the first copper layer.

5. The printed wiring board according to claim 1, wherein each of the first wiring lines has a line width in a range of from 1 μm to 5 μm, and each of the second wiring lines has a line width in a range of from 1 μm to 5 μm.

6. The printed wiring board according to claim 1, wherein the first wiring lines and the second wiring lines are arrayed such that a line space between the first wiring lines and the second wiring lines is in a range of from 1 μm to 5 μm.

7. The printed wiring board according to claim 1, wherein each of the first wiring lines has a thickness in a range of 70% to 130% of a thickness of a base wiring line, and each of the second wiring lines has a thickness in a range of 70% to 130% of a thickness of a base wiring line.

8. The printed wiring board according to claim 1, wherein the insulative material of the insulation layer comprises an epoxy resin material and an inorganic filler material contained in the epoxy resin material in an amount of 30 mass % to 80 mass %.

9. The printed wiring board according to claim 1, wherein the insulative material of the insulation layer comprises a photosensitive resin.

10. The printed wiring board according to claim 1, wherein the conductive wiring pattern is forming a portion of an outermost conductive layer.

11. The printed wiring board according to claim 10, wherein the conductive wiring pattern is formed such that an upper surface of the conductive wiring pattern and an upper surface of the conductive pads form a same plane.

12. The printed wiring board according to claim 10, wherein the conductive wiring pattern is formed such that a space between the conductive wiring pattern and the conductive pads is in a range of 5 μm to 15 μm.

13. The printed wiring board according to claim 1, further comprising:
   an inner conductive layer formed on the insulation layer on an opposite side with respect to the conductive wiring pattern such that the insulation layer is interposed between the conductive wiring pattern and the inner conductive layer.

14. The printed wiring board according to claim 13, wherein the inner conductive layer comprises a planar conductive layer extending in an array direction of the conductive wiring pattern.

15. The printed wiring board according to claim 14, further comprising:
   a grounding layer, wherein the planar conductive layer is electrically connected to the grounding layer.

16. The printed wiring board according to claim 1, wherein the first metal layer is an electroless plating metal layer, and the second metal layer is a sputtered metal layer.

17. The printed wiring board according to claim 1, wherein each of the second wiring lines comprises a first copper layer sputtered on the second metal layer, and a second copper layer electrolytically plated on the first copper layer.

18. The printed wiring board according to claim 2, wherein each of the first wiring lines has a line width in a range of from 1 μm to 5 μm, and each of the second wiring lines has a line width in a range of from 1 μm to 5 μm.

19. The printed wiring board according to claim 18, wherein the first wiring lines and the second wiring lines are arrayed such that a line space between the first wiring lines and the second wiring lines is in a range of from 1 μm to 5 μm.

20. The printed wiring board according to claim 2, wherein each of the first wiring lines has a thickness in a range of 70% to 130% of a thickness of a base wiring line, and each of the second wiring lines has a thickness in a range of 70% to 130% of a thickness of a base wiring line.

* * * * *